United States Patent
Andideh et al.

(10) Patent No.: US 6,664,168 B1
(45) Date of Patent: Dec. 16, 2003

(54) METHOD OF MAKING AN ON-DIE DECOUPLING CAPACITOR FOR A SEMICONDUCTOR DEVICE

(75) Inventors: Ebrahim Andideh, Portland, OR (US); R. Scott List, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/202,807

(22) Filed: Jul. 24, 2002

(65) Prior Publication Data (65)

(51) Int. Cl.[7] .............................. H01L 21/20
(52) U.S. Cl. .................. 438/396; 438/387; 438/239; 438/244; 438/253
(58) Field of Search ................. 438/239, 240, 438/244, 250, 253, 255, 386, 387, 393, 396, 398, 399

(56) References Cited

U.S. PATENT DOCUMENTS

| | | | |
|---|---|---|---|
| 6,211,035 B1 * | 4/2001 | Moise et al. ................. | 438/396 |
| 6,436,787 B1 * | 8/2002 | Shih et al. ................... | 438/396 |
| 6,475,854 B2 * | 11/2002 | Narwankar et al. ......... | 438/238 |

* cited by examiner

Primary Examiner—Kevin M. Picardat
(74) Attorney, Agent, or Firm—Mark V. Seeley

(57) ABSTRACT

A method of making an on-die decoupling capacitor for a semiconductor device is described. That method comprises forming a first barrier layer on a conductive layer. The upper surface of the first barrier layer is modified to enable a dielectric layer with an acceptable nucleation density to be formed on the first barrier layer. A dielectric layer is formed on the first barrier layer, and a second barrier layer is formed on the dielectric layer.

3 Claims, 2 Drawing Sheets

METHOD OF MAKING AN ON-DIE DECOUPLING CAPACITOR FOR A SEMICONDUCTOR DEVICE

FIELD OF THE INVENTION

The present invention relates to a method for making semiconductor devices, in particular, those that include decoupling capacitors.

BACKGROUND OF THE INVENTION

Decoupling capacitors may be included in an integrated circuit to reduce inductive noise. To decrease inductance., and cost, decoupling capacitors may be formed on the chip instead of elsewhere within the device's package. Examples of methods for forming semiconductor devices that include on-die decoupling capacitors are described in Ser. No. 09/965,972, "Fabrication of 3-D Capacitor with Dual Damascene Process," filed Sep. 27, 2001; Ser. No. 09/895,362, "On-Die De-Coupling Capacitor Using Bumps or Bars and Method of Making Same," filed Jun. 29, 2001; and Ser. No. 09/962,786, "Top Electrode Barrier for On-Chip Die De-Coupling Capacitor and Method of Making Same," filed Sep. 24, 2001—each assigned to this application's assignee.

FIG. 1 represents a device that Ser. No. 09/965,972 describes in which on-die decoupling capacitor 50 separates conductor 40 from conductor 17. Capacitor 50 includes first conductive barrier layer 19, high k dielectric layer 20, and second conductive barrier layer 21. Because the barrier layers and the dielectric layer line the via and trench, the capacitor covers more area than a planar capacitor would cover. As a result, this 3-D capacitor may provide a 4× increase in capacitance, when compared to the capacitance that a planar capacitor would be expected to generate.

FIG. 2 represents a device, which Ser. No. 09/895,362 describes, in which a bump connection contacts an on-die decoupling capacitor. The decoupling capacitor, which comprises upper electrode 14, high k dielectric layer 16 and lower electrode 18, separates $V_{cc}$ line 72—formed in the device's upper metal layer—from bump metal 84. FIG. 3 represents a device, which Ser. No. 09/962,786 describes, in which barrier layer 12 is formed on upper electrode 14 of the decoupling capacitor stack, which also includes high k dielectric layer 16 and lower electrode 18.

When making on-die decoupling capacitors, the lower electrode may be made from tantalum nitride and the high k dielectric layer may be made from tantalum pentoxide. When such a high k dielectric material is deposited on such a substrate, e.g., by using a conventional atomic layer chemical vapor deposition process, the nucleation density of the resulting high k dielectric layer may be unacceptable. As a result, the dielectric layer may contain a significant number of pinholes.

Forming the lower electrode from titanium nitride instead of tantalum nitride may mitigate nucleation problems. Because, however, titanium nitride may be more difficult to etch than tantalum nitride, it may not be desirable to substitute titanium nitride for tantalum nitride to form the lower electrode. As an alternative to making that substitution, forming a very thin aluminum oxide seed layer on a tantalum nitride layer prior to depositing a tantalum pentoxide layer on the tantalum nitride layer may improve the nucleation density for the tantalum pentoxide layer. Because adding such a seed layer to the high k dielectric layer will increase the effective thickness of the high k film, the presence of the seed layer may reduce the capacitance density in an unacceptable manner.

Accordingly, there is a need for an improved process for making an on-die decoupling capacitor. There is a need for such a process that enables a dielectric layer with an acceptable nucleation density to be formed on a barrier layer. There is also a need for such a process for making an on-die decoupling capacitor that forms on a lower electrode, e.g., one including tantalum nitride, a high k dielectric layer, e.g., one including tantalum pentoxide, that does not have a high pinhole density. The method of the present invention provides such a process.

DETAILED DESCRIPTION OF THE PRESENT INVENTION

A method of making an on-die decoupling capacitor for a semiconductor device is described. That method comprises forming a first barrier layer on a conductive layer. The upper surface of the first barrier layer is modified to enable a dielectric layer with an acceptable nucleation density to be formed on the first barrier layer. In the method of the present invention, a dielectric layer is formed on the first barrier layer, and a second barrier layer is formed on the dielectric layer.

In the following description, a number of details are set forth to provide a thorough understanding of the present invention. It will be apparent to those skilled in the art, however, that the invention may be practiced in many ways other than those expressly described here. The invention is thus not limited by the specific details disclosed below.

In the method of the present invention, an on-die decoupling capacitor is formed on substrate 100, e.g., a silicon wafer upon which various conducting layers and insulating layers have been formed. In this embodiment, substrate 100 includes conductive layers 102 and 103, which have been formed in dielectric layer 104. Conductive layers 102 and 103 and dielectric layer 104 may comprise materials that are conventionally used to make semiconductor devices, and may be formed using conventional processes, which are well known to those skilled in the art. Conductive layers 102 and 103 may comprise copper, and dielectric layer 104 may comprise silicon dioxide or a low k dielectric material, e.g., a carbon or fluorine doped oxide or a polymer. In a particularly preferred embodiment, substrate 100 includes all of the metal layers to be integrated into the device, or all of those layers except the final metal layer.

Figure 1:
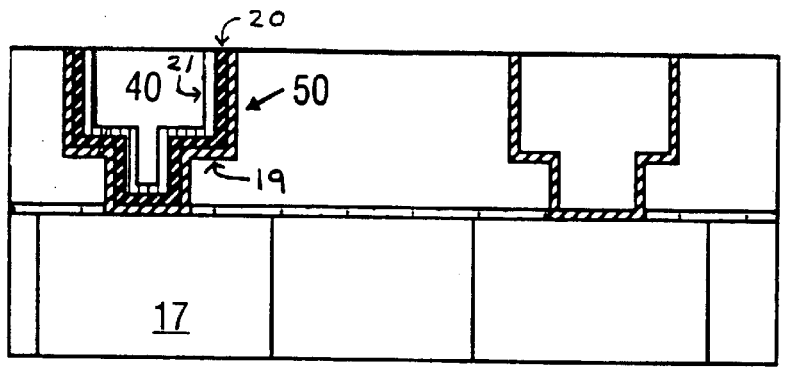
FIGS. 1–3 represent cross-sections of semiconductor devices that include on-die decoupling capacitors.
Figure 2:
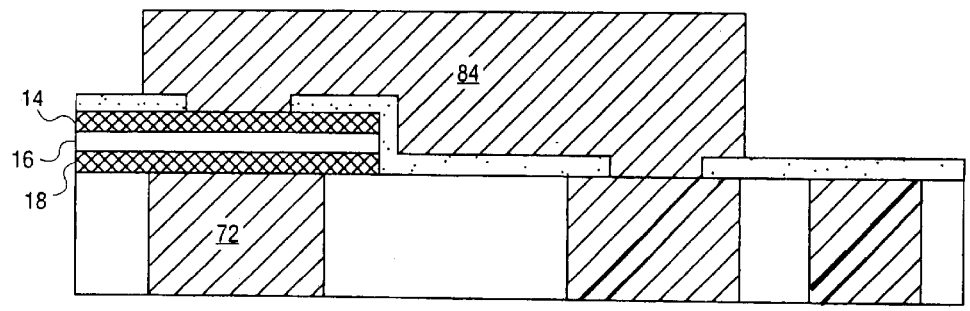
Figure 3:
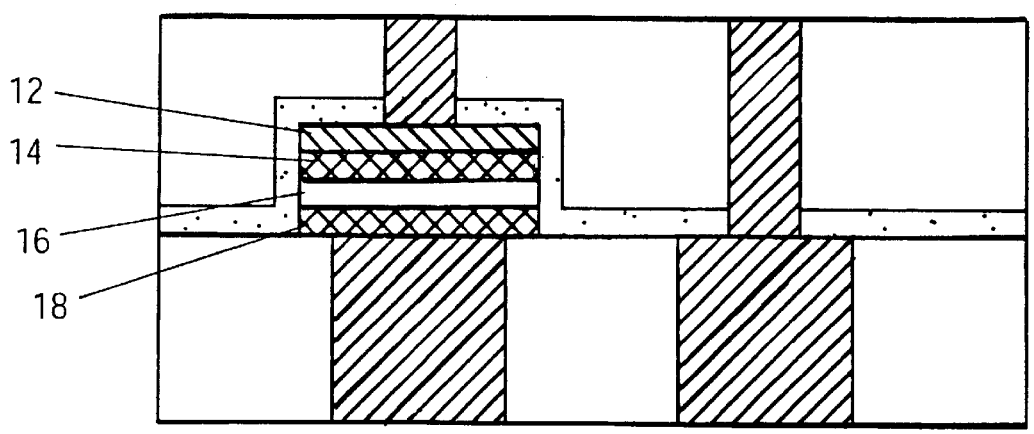
Figure 4A:
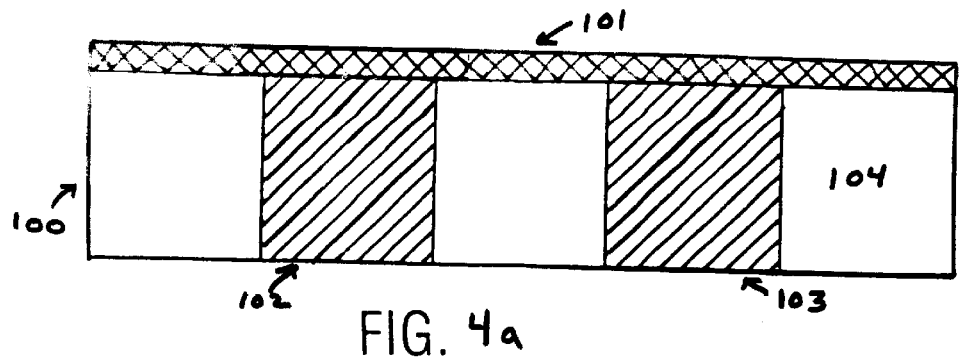
FIGS. 4a–4c represent cross-sections of structures that may result when certain steps are used to carry out an embodiment of the method of the present invention.

Substrate 100 may be placed in a chemical vapor deposition apparatus—preferably a conventional atomic layer chemical vapor deposition ("ALCVD") reactor. Such an ALCVD reactor is commercially available from various semiconductor equipment manufacturers. First barrier layer 101 may be formed on conductive layers 102 and 103 and dielectric layer 104 using a conventional ALCVD process to generate the structure represented by FIG. 4a. In the method of the present invention, first barrier layer 101 will form the lower electrode for the decoupling capacitor to be built on substrate 100. First barrier layer 101 may comprise any material that may be used to form an on-die decoupling capacitor, e.g., tantalum nitride, titanium nitride, tungsten nitride, or tungsten silicon nitride.

When a high k dielectric layer is deposited on first barrier layer 101, the surface properties of first barrier layer 101 may prevent the formation of a dielectric layer that has an acceptable nucleation density. To enable a high k dielectric layer with improved nucleation density to be formed on first barrier layer 101, the method of the present invention modifies the upper surface of that layer prior to depositing the high k dielectric layer on that surface.

The surface properties of first barrier layer 101 may be changed in various ways. For example, the upper surface of first barrier layer 101 may be exposed to a plasma generated from a treatment gas. Suitable gases from which a surface altering plasma may be derived include steam, inert gases such as argon or helium, nitrogen, oxygen, or hydrogen. Mixtures of these gases may be used as well, e.g., a forming gas that includes up to about 5% hydrogen in nitrogen. Although several examples of gases that may be used are identified here, any gas or gas mixture from which a surface altering plasma may be generated falls within the spirit and scope of the present invention.

In one embodiment, first barrier layer 101 is formed, and the surface treatment step is applied, in situ. When performing these process steps in situ, the surface treatment gas is introduced into the ALCVD reactor after the gas mixture, which was used when forming first barrier layer 101, has been purged from the reactor. A plasma is then struck, while the reactor is operated at a selected power, pressure, and substrate temperature.

Optimum operating conditions and treatment gas flow rates may vary depending upon the treatment gas used, the materials used to form first barrier layer 101 and the high k dielectric layer to be formed on its surface, and the desired attributes for the decoupling capacitor. Similarly, the optimum time period during which the wafer should be exposed to the plasma may vary depending upon the treatment gas employed, the materials used to make the device, and the device's desired characteristics. As an alternative to forming first barrier layer 101 and applying the surface treatment step in situ, these process steps may take place ex situ. Rather than apply these process steps sequentially in the same reactor chamber, the wafer (or wafers) may be removed from the reactor used to form first barrier layer 101, then transferred to another chamber within the same tool (or to a separate tool), where the surface treatment step is performed.

As an alternative to exposing first barrier layer 101 to a surface altering plasma, first barrier layer 101 may be exposed to a reactive gas for a sufficient time to modify that layer's upper surface to facilitate subsequent formation of a high k dielectric layer that has an acceptable nucleation density. Suitable reactive gases, to which first barrier layer 101 may be exposed, include silane ($SiH_4$), germane ($GeH_4$), and nitrous oxide ($N_2O$). Although several examples of reactive gases that may be used are identified here, any gas or gas mixture that may alter the surface of first barrier layer 101 to enable a high k dielectric layer with improved nucleation density to be formed on that surface falls within the spirit and scope of the present invention.

In this alternative embodiment, substrate 100 is preferably heated to a temperature of at least about 150° C. before the reactive gas is fed into the reactor. The optimal temperature may depend upon the reactive gas and reactor used, other operating parameters, and the desired characteristics for the device. As with the plasma exposure process described above, first barrier layer 101 may be formed and this alternative technique may be applied in situ or ex situ.

By exposing first barrier layer 101 to one or more reactive gases, or to a plasma derived from one or more of the gases specified above, the surface of that layer may be modified to promote formation of a high k dielectric layer with improved nucleation density. It is believed that such a surface treatment causes that effect because it serves to increase the roughness of the barrier layer and/or to increase the number of dangling bonds located on the layer surface. By increasing surface roughness, additional sites for receiving tantalum, or another species, may be created. By increasing the number of dangling bonds, the number of sites on the barrier layer surface to which tantalum, or another species, may bond can also increase.

Figure 4B:
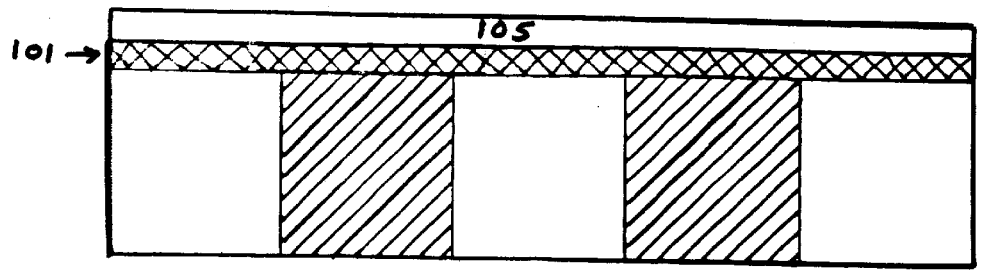

After the upper surface of first barrier layer 101 is modified, e.g., by subjecting that layer to an appropriate surface altering treatment, high k dielectric layer 105 is deposited on first barrier layer 101 to generate the structure illustrated by FIG. 4b. High k dielectric layer 105 may comprise tantalum pentoxide ($Ta_2O_5$), titanium oxide, barium strontium titanate (BST), or lead zirconium titanate. The optimum thickness for high k dielectric layer 105 may vary depending upon the material used to make that layer and the desired characteristics for the device. When BST is used to form high k dielectric layer 105, first barrier layer 101 may comprise platinum, ruthenium, or iridium in addition to, or as an alternative to, the materials identified above for forming that barrier layer. Although some examples of materials that may be used to form high k dielectric layer 105 are mentioned here, many other suitable compounds exist, as will be apparent to those skilled in the art.

High k dielectric layer 105 may be deposited onto first barrier layer 101 using conventional techniques, e.g., a conventional atomic layer chemical vapor deposition process. In a preferred embodiment, the surface modifying treatment described above and this subsequent deposition step may take place in situ in the ALCVD reactor—e.g., by simply changing the gas streams that are fed into the reactor. Alternatively, these process steps may take place ex situ, with the high k dielectric layer deposition step taking place in a separate chamber or separate tool from where the surface treatment step was applied.

Figure 4C:
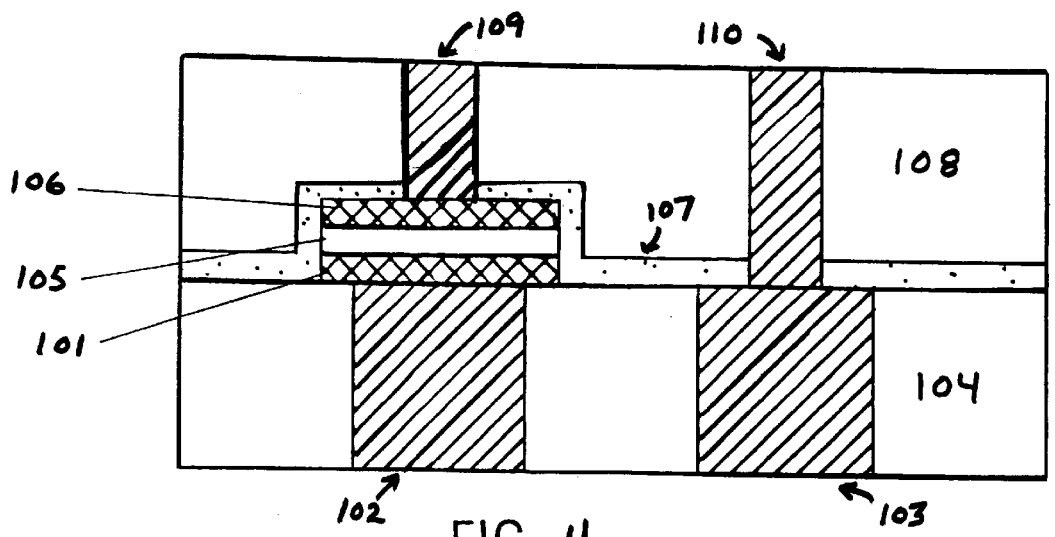

After high k dielectric layer 105 is formed, conventional process steps may be applied to generate the structure shown in FIG. 4c. That structure includes second barrier layer 106, which will form the upper electrode for the decoupling capacitor. Second barrier layer 106, like first barrier layer 101, may comprise a material that is conventionally used to form on-die decoupling capacitors, e.g., tantalum nitride, titanium nitride, tungsten nitride, or tungsten silicon nitride. In an embodiment of the present invention, third barrier layer 107 may be formed on the decoupling capacitor stack, conductive layer 103 and dielectric layer 104, as shown. Third barrier layer 107 may prevent copper from diffusing into the dielectric layer formed on its surface and may act as an etch stop.

Dielectric layer 108 may be formed on third barrier layer 107, and conductive layers 109 and 110 may be formed within dielectric layer 108, as shown in FIG. 4c. Third barrier layer 107 may comprise silicon nitride or another suitable material for preventing copper diffusion, dielectric layer 108 may comprise silicon dioxide or a low k dielectric material, and conductive layers 109 and 110 may comprise copper. Third barrier layer 107, dielectric layer 108, and conductive layers 109 and 110 may be formed using conventional equipment and processes, as is well known to those skilled in the art. In the illustrated embodiment, conductive layer 109 contacts the capacitor stack, which separates conductive layer 102 from conductive layer 109, while conductive layer 110 directly contacts conductive layer 103.

The method of the present invention may enable a high k dielectric layer that has an acceptable nucleation density to be formed on a barrier layer, which will form the lower electrode for an on-die decoupling capacitor. As a result, this method may enable a high k dielectric layer to be created that has a lower pinhole density, when compared to high k dielectric layers formed on untreated barrier layers.

Features shown in the above referenced drawings are not intended to be drawn to scale, nor are they intended to be shown in precise positional relationship. Additional steps that may be included in the above described method have been omitted as they are not useful to describe aspects of the present invention.

Although the foregoing description has specified certain steps and materials that may be used in such a method, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method of making an on-die decoupling capacitor for a semiconductor device comprising:

forming a first barrier layer on a copper containing layer, the first barrier layer having an upper surface;

modifying the upper surface of the first barrier layer by exposing the upper surface to a reactive gas that is selected from the group consisting of silane, germane, and nitrous oxide;

forming a dielectric layer on the first barrier layer; and forming a second barrier layer on the dielectric layer.

2. The method of claim 1 wherein the first barrier layer forms the lower electrode for the decoupling capacitor and comprises tantalum nitride; the second barrier layer forms the upper electrode for the decoupling capacitor and comprises tantalum nitride; and the dielectric layer comprises tantalum pentoxide.

3. The method of claim 2 wherein the upper surface is exposed to the reactive gas after the upper surface has been heated to a temperature of at least about 150° C.

\* \* \* \* \*